United States Patent
Scheuer et al.

(10) Patent No.: US 6,493,450 B1
(45) Date of Patent: Dec. 10, 2002

(54) INTERCOM SYSTEM INCLUDING IMPROVED AUTOMATIC SQUELCH CONTROL FOR USE IN SMALL AIRCRAFT AND OTHER HIGH NOISE ENVIRONMENTS

(75) Inventors: Mark S. Scheuer, Knoxville, TN (US); Charles A. Johnson, Johnson City, TN (US)

(73) Assignee: PS Engineering, Inc., Knoxville, TN (US)

( * ) Notice: Subject to any disclaimer, the term of this patent is extended or adjusted under 35 U.S.C. 154(b) by 0 days.

(21) Appl. No.: 09/207,560

(22) Filed: Dec. 8, 1998

(51) Int. Cl.[7] .................................................. H03G 3/20
(52) U.S. Cl. .......................... 381/57; 381/110; 455/222
(58) Field of Search ............................. 381/56, 57, 58, 381/71.2, 73.1, 86, 91, 92, 94.1, 94.7, 110, 122, 95, FOR 124; 455/212, 218, 219, 221, 222

(56) References Cited

U.S. PATENT DOCUMENTS

| | | | |
|---|---|---|---|
| 3,644,674 A | * 2/1972 | Mitchell et al. | 455/212 |
| 3,999,015 A | 12/1976 | Snyder et al. | |
| 4,941,187 A | 7/1990 | Slater | |
| 5,564,090 A | * 10/1996 | Beauchamp et al. | 455/222 |
| 5,651,070 A | * 7/1997 | Blunt | 381/56 |
| 5,774,557 A | 6/1998 | Slater | |
| 6,141,426 A | * 10/2000 | Stobba et al. | 381/110 |
| 6,169,807 B1 | * 1/2001 | Sansur | 381/57 |
| 6,195,572 B1 | * 2/2001 | Patterson et al. | 455/570 |

FOREIGN PATENT DOCUMENTS

| | | | | |
|---|---|---|---|---|
| GB | 2258098 | * | 1/1993 | 455/222 |

* cited by examiner

*Primary Examiner*—Xu Mei
(74) *Attorney, Agent, or Firm*—B. Noël Kivlin

(57) ABSTRACT

An automatic squelch is provided within an intercom to control the gating of a microphone signal path. The automatic squelch includes an analog-to-digital converter coupled to receive an analog microphone input signal which is configured to convert the analog microphone input signal into a digital input signal. A peak detector is further provided to maintain a peak value indicative of peaks in the digital input signal. The peak value maintained by the peak detector reacts relatively quickly to changes in the digital input signal. In one implementation, when the digital input signal is larger than the peak value, the peak value is set at the level of the digital input signal. When the digital input signal is less than the peak value, the peak value is "decayed" or reduced at a relatively fast decay rate. A background noise detector is further provided for maintaining a background value indicative of background noise in the digital input signal. In one implementation, the background value is adjusted by comparing the peak value to the background value. When the peak value is greater than the background value, the background value is increased at a relatively slow attack rate. When the peak value is less than the background value, the background value is decreased at a relatively slow decay rate. The background noise detector thus varies the background value relatively slowly in response to changes in the peak value. A comparator is further provided to determine whether the peak value exceeds a predetermined threshold value. In one implementation, the predetermined threshold value is obtained through a table lookup function wherein the background value is used as an index to index into a lookup table including a plurality of corresponding threshold values. If the peak value exceeds the threshold value, a one-shot timer is triggered to activate a microphone signal path. In one implementation, hysteresis is further provided to lessen the threshold required to retrigger the one shot timer while it is active. The functionality of the peak detector, background noise detector, and one shot timer may be implemented by software code executed within a microcontroller.

50 Claims, 6 Drawing Sheets

INTERCOM SYSTEM INCLUDING IMPROVED AUTOMATIC SQUELCH CONTROL FOR USE IN SMALL AIRCRAFT AND OTHER HIGH NOISE ENVIRONMENTS

BACKGROUND OF THE INVENTION

1. Field of the Invention

This invention relates to intercom systems and, more particularly, to intercom systems employing automatic squelch circuits for use in small aircraft or other high noise environments.

2. Description of the Related Art

In a typical small aircraft intercom system, several different audio channels are controlled and combined to form output audio to be heard by users. For example, audio channels are typically provided to allow the pilot, co-pilot and passengers to communicate with one another through microphone inputs. External communications through a communications radio are further accommodated to allow communications between, for example, an air traffic controller and the pilot and/or co-pilot. Similarly, an interface for connection to a telephone may be provided. Audio associated with additional aspects of the control of the aircraft, such as altimeter warnings and marker beacon signals, may also be integrated within the intercom system. Finally, the aircraft intercom system may accommodate music inputs to allow the pilot, co-pilot and/or passengers to listen to music.

During flight, the cabin of a small aircraft is typically quite noisy, due to both engine noise and wind noise. Accordingly, the occupants of the aircraft cabin typically wear headset units having headphones and microphones. Rather than leaving microphones on continuously, squelch circuits are typically provided to activate selected microphones upon the presence of a user's voice. This advantageously prevents unwanted aircraft cabin noise picked up by the microphones from being introduced into the intercom system when voice audio is not detected.

The squelch circuits of many aircraft intercom systems have manual controls which must be set by the user. The manual squelch control is used to set the threshold level at which an input signal must rise before the microphone signal path is activated. As the noise in the aircraft cabin increases or decreases, corresponding adjustments to the squelch control may be necessary to maintain proper operation of the intercom system. Unfortunately, the noise in the aircraft cabin may vary considerably during a given flight, thus requiring multiple adjustments to the manual squelch control.

Due to the varying types of audio handled by a typical aircraft intercom system, various user operated controls in addition to the manual squelch control are also provided to select various modes of operation. In general, it is desirable that apparatus for use by pilots and co-pilots in an aircraft be as simple as possible to use while allowing flexibility. Particularly for safety, it is further desirable to reduce the number of controls which must be manually operated.

Thus, some aircraft intercom systems utilize automatic squelch circuits. In such systems, as changes in the noise level in the aircraft cabin occur, the threshold for activating a corresponding microphone path is automatically re-adjusted. This thus allows simplified operation.

However, various aircraft intercom systems having automatic squelch circuits are believed to suffer from a number of drawbacks. For example, it is believed that some intercom systems having automatic squelch controls do not operate optimally in that they may be prone to relatively long delays when voice is initially presented, thus clipping the initial speech of a user. Similarly, these systems may further turn off prematurely, thus clipping the middle or end portions of normal speech.

Additionally, some systems are not associated with good repeatability, in terms of consistent operation with varying operating conditions. That is, as operating conditions including temperature, power supply voltage, and background noise vary, the operation of some systems may be adversely affected.

Finally, some systems require a relatively large number of components for implementation. This may result in increased cost and/or power consumption. Furthermore, the requirement of a relatively large number of components may further inhibit compact design, which is another important feature for a small aircraft intercom system.

Therefore, it would be desirable to provide an automatic squelch for an intercom system used in small aircraft or other high noise environments which minimizes unwanted clipping of speech. It would further be desirable to provide an intercom system which operates consistently, which may be implemented using a relatively small overall number of components, and which consumes relatively low power.

SUMMARY OF THE INVENTION

Various problems described above are in large part solved by an intercom system for use in a small aircraft or other high noise environment including an automatic squelch in accordance with the present invention. In one embodiment, an automatic squelch is provided within an intercom to control the gating of a microphone signal path. The intercom system may include various audio inputs including inputs for receiving microphone signals from the pilot, co-pilot and passengers, an input for receiving aircraft radio audio, and a music input. The intercom system may selectively combine and amplify the audio inputs to form audio output signals that drive the headphones of users. The automatic squelch includes an analog-to-digital converter coupled to receive an analog microphone input signal which is configured to convert the analog microphone input signal into a digital input signal. A peak detector is further provided to maintain a peak value indicative of peaks in the digital input signal. The peak value maintained by the peak detector reacts relatively quickly to changes in the digital input signal. In one implementation, when the digital input signal is larger than the peak value, the peak value is set at the level of the digital input signal. When the digital input signal is less than the peak value, the peak value is "decayed" or reduced at a relatively fast decay rate. A background noise detector is further provided for maintaining a background value indicative of background noise in the digital input signal. In one implementation, the background value is adjusted by comparing the peak value to the background value. When the peak value is greater than the background value, the background value is increased at a relatively slow attack rate. When the peak value is less than the background value, the background value is decreased at a relatively slow decay rate. The background noise detector thus varies the background value relatively slowly in response to changes in the peak value. A comparator is further provided to determine whether the peak value exceeds a predetermined threshold value. In one implementation, the predetermined threshold value is obtained through a table lookup function wherein the background value is used as an index to index into a lookup table including a plurality of corresponding threshold values. If the peak value exceeds the threshold value, a one-shot timer is triggered to activate a microphone signal path. In one implementation, hysteresis is further provided to lessen the threshold required to retrigger the one shot timer while it is active. The functionality of the peak detector, background noise detector, and one shot timer may be implemented by software code executed within a microcontroller.

An intercom system employing the improved automatic squelch may advantageously minimize unwanted clipping of speech. Additionally, the improved automatic squelch may result in consistent operation regardless of varying operating conditions, may be implemented using a relatively small number of components, and may consume relatively low power.

BRIEF DESCRIPTION OF THE DRAWINGS

Other objects and advantages of the invention will become apparent upon reading the following detailed description and upon reference to the accompanying drawings in which.

Figure 1:
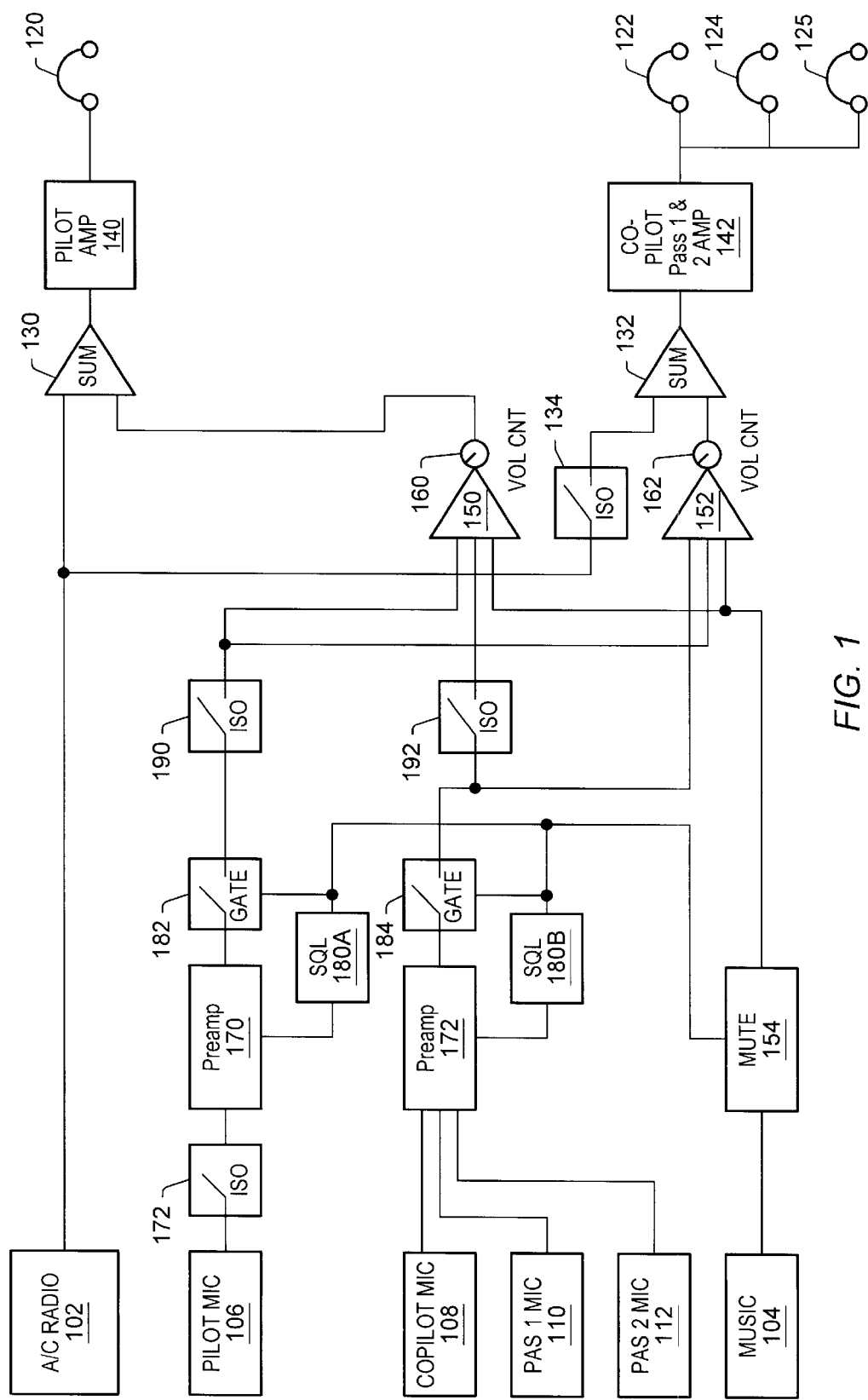
FIG. 1 is a block diagram illustrating features of one embodiment of an intercom system that employs an automatic squelch in accordance with the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, FIG. 1 is a block diagram illustrating features of one embodiment of an intercom system that employs an automatic squelch in accordance with the present invention. In the embodiment of FIG. 1, aircraft radio audio is provided at an aircraft radio input 102, music audio is provided at a music input 104, and microphone audio is provided at a set of microphone inputs formed by a pilot microphone input 106, a copilot microphone input 108, a passenger1 microphone input 110, and a passenger2 microphone input 112. These audio inputs are selectively controlled, combined and amplified to form audio output signals which drive a pilot headphone 120, a copilot headphone 122, and passenger headphones 124 and 125. It is contemplated that various additional audio signals may further be controlled and combined in the intercom system, including control signals such as altimeter warnings and marker beacon signals, and telephone audio.

The aircraft radio audio at aircraft radio input 102 is routed to a summing amplifier 130, and is similarly routed to a second summing amplifier 132 through an isolate switch 134. As depicted, summing amplifier 130 generates a combined signal which is amplified by amplifier 140 to provide an audio output signal to drive pilot headphone 120. Similarly, summing amplifier 132 generates a combined audio signal which is amplified by amplifier 142 to provide an audio output signal to drive copilot headphone 122 as well as passenger headphones 124 and 125.

Music from music input 104 is selectively provided to summing amplifiers 150 and 152 through a mute control circuit 154. Summing amplifier 150 generates a combined audio output signal representing music and microphone audio which is provided to an input of summing amplifier 130 through a volume control 160. Similarly, summing amplifier 152 generates a combined audio output signal representing music and microphone audio which is provided to an input of summing amplifier 132 through a volume control 162. Mute control circuit 154 selectively mutes the music audio whenever microphone voice audio or aircraft radio audio is present. In one specific implementation, mute control circuit 154 implements a "soft" muting function wherein the music audio is attenuated significantly, but is not completely muted, whenever microphone voice audio or aircraft radio audio is present.

Pilot microphone audio is provided from pilot microphone input 108 to a preamplifier 170 through an isolate switch 172. Copilot microphone audio, passenger1 microphone audio, and passenger2 microphone audio are provided to a preamplifier 176. As will be described in further detail below, an automatic squelch control 180A is provided to automatically detect voice audio introduced at pilot microphone input 106 and to selectively activate a corresponding electronic gate or switch 182 in response to detecting such voice audio. Similarly, an automatic squelch control 180B is provided to detect voice audio introduced at any of the copilot or passenger microphone inputs 108, 110, or 112 and to selectively activate a corresponding electronic gate or switch 184 in response to detecting such voice audio. Microphone audio signals gated through gates 182 and 184 are provided to inputs of summing amplifier 150 through isolate switches 190 and 192, and are further provided to inputs of summing amplifier 152.

In accordance with the block diagram of FIG. 1, audio signals from aircraft radio input 102, from music input 104, and from microphone inputs 106, 108, 110, and 112 are selectively controlled, combined and amplified to generate audio output signals to drive the users' headphones. When isolate switches 134, 190 and 192 are closed, the same audio is heard by all users. When isolate switches 134, 172, 190 and 192 are opened, the pilot hears only the aircraft radio audio, while the copilot and passengers hear only music and each others' microphone audio.

Since gates 182 and 184 are activated only when corresponding audio is detected, introduction of background noise picked up by the microphones when voice audio is not detected is not introduced into the system and is not heard by the users. Furthermore, since each of the automatic squelch circuits 180A and 180B is automatic, no user adjustment is needed, and thus ease of use and safety are promoted.

It is noted that the intercom system of FIG. 1 may further implement various additional functions, such as push-to-talk detection, expansion capability, and others, as desired. In addition, it is further noted that various other specific implementations of an intercom system employing an automatic squelch in accordance with the following description are also possible. For example, while the embodiment of FIG. 1 employs a single automatic squelch control for detecting copilot and passenger microphone voice audio, a separate automatic squelch control for each microphone input could alternatively be provided.

Figure 2:
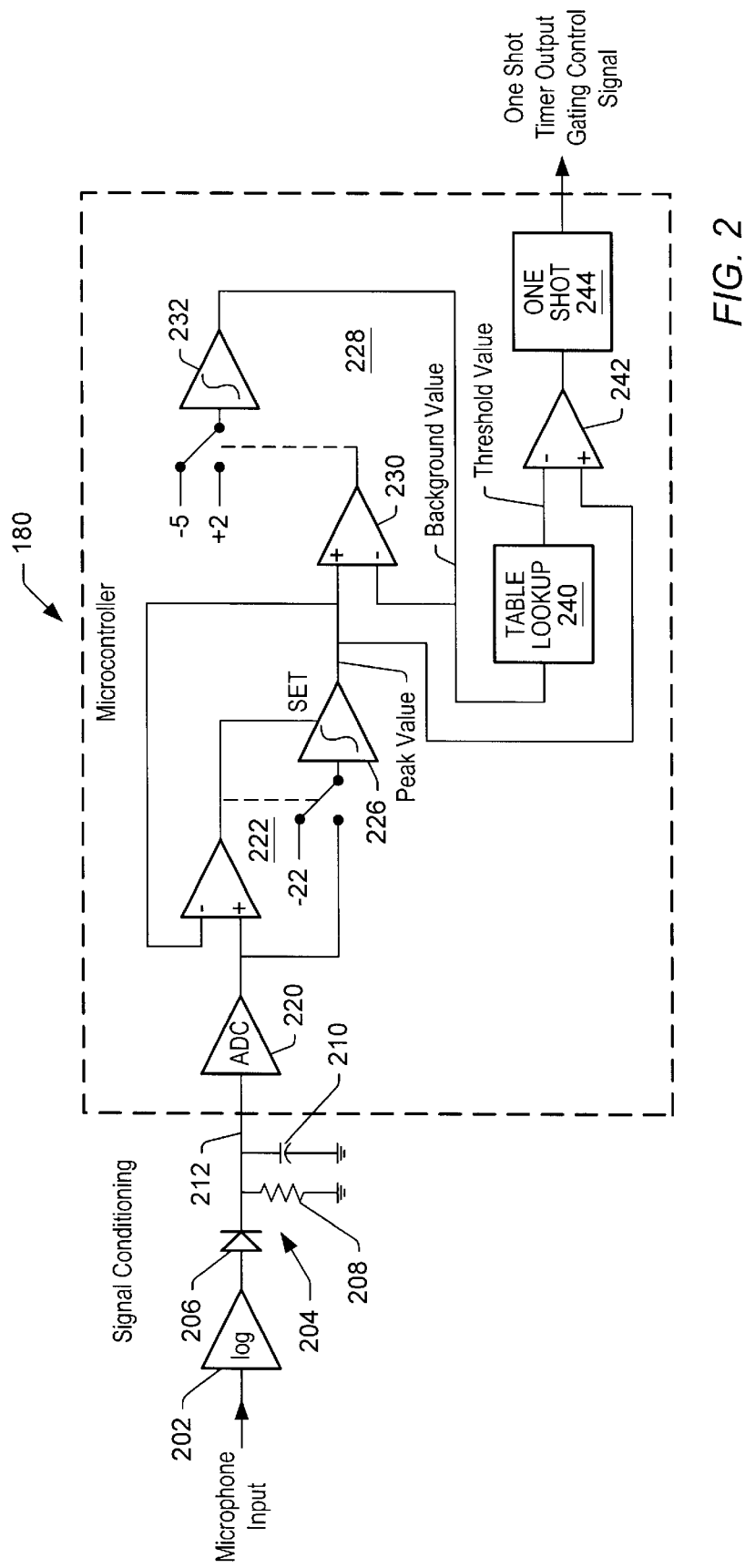
FIG. 2 is a functional block diagram illustrating aspects of one embodiment of an improved automatic squelch.

FIG. 2 is a functional block diagram illustrating aspects of one embodiment of an improved automatic squelch 180 for intercom systems used in small aircraft or other high noise environments. For example, each of the automatic squelch controls 180A and 180B of the intercom system of FIG. 1 may be implemented in accordance with the improved automatic squelch 180 of FIG. 2.

The automatic squelch 180 receives as an input a microphone input signal, which may be pre-amplified (as illustrated by FIG. 1). A one-shot timer output signal is generated by automatic squelch 180 to control the gating of a microphone signal within an intercom system. Further details regarding this operation are provided further below.

In the particular embodiment of FIG. 2, the microphone input signal is first conditioned by passing it through a log amp 202 and a peak detector 204 illustratively formed by a diode 206, a resistance 208, and a capacitor 210. It is noted that by passing the microphone input signal through log amp 202 and peak detector 204, the ability to distinguish background noise from voice signals may be improved, and a lower resolution digital to analog converter may be employed without losing significant information. It is specifically contemplated, however, that in other embodiments log amp 202 and/or peak detector 204 may be omitted.

The analog microphone input signal, as conditioned in this embodiment by log amp 202 and peak detector 204, is provided to an analog to digital converter 220 at line 212. In one particular implementation, analog to digital converter 220 converts the analog signal at line 212 into an 8-bit digital value. Furthermore, in one particular implementation, analog to digital converter 220 operates at an 8000 Hz sampling rate. Other embodiments may convert the analog microphone input signal into digital values of differing widths, and may sample the analog microphone input signal at differing sampling rates.

As illustrated, the digital signal generated by analog to digital converter 220 is provided to a peak detector 222 collectively formed by a comparator 224 and an integrator 226. As will be described in further detail below, peak detector 222 is provided to maintain a peak value indicative of peaks in the microphone input signal. In the illustrated embodiment, when the digital input signal generated by analog to digital converter 220 is larger than the peak value maintained at the output of integrator 226, the peak value is set at the level of the digital input signal. When the digital input signal is less than the peak value, the peak value is "decayed" or reduced at a relatively fast decay rate (e.g., as denoted by the "–22" input of integrator 226). This operation will be described in further detail below.

A background noise detector 228 is formed by a second comparator 230 and a second integrator 232. More particularly, in this embodiment, comparator 230 compares the peak value maintained by integrator 226 with a background noise value generated by integrator 232. When the peak value is greater than the background noise value, as determined by comparator 230, the background noise value is increased by integrator 232. When the peak value is less than the background noise value, the background noise value is decreased. It is noted that in the depicted embodiment, the decay rate (e.g., "–5") associated with integrator 232 is slightly greater than its attack rate (e.g., "–2"). Additionally, the decay rate associated with integrator 226 (e.g., "–22") is significantly greater than that ("–5") of integrator 232. As a result these relative characteristics, the peak value tracks peaks associated with the microphone input signal relatively closely, while the background noise value is much less sensitive to such peaks, thus being generally indicative of background noise. In other words, due to the relatively fast response time associated with peak detector 222, the peak value maintained by integrator 226 tracks the peak values of the microphone signal over time relatively closely. This peak value represents both background noise and voice audio, if present. The background value maintained by background noise detector 228 is increased when the peak value is greater than the background value, and is decreased when the peak value is less than the background value. Due to the relatively slow response time associated with integrator 232, however, momentary peaks in the peak value resulting from voice audio do not appreciably affect the background value. Over time the background value is instead reflective of the background noise content within the peak value signal.

A table lookup function 240 may be implemented to obtain a threshold value based upon the background value. In one particular implementation, the lookup table includes 256 entries which correlate appropriate threshold values with background noise values. In general, higher threshold values are used as background values increase. The threshold value for a given background value is used in a comparison operation implemented by comparator 242 to determine whether a one shot timer 244 should be triggered. In the depicted embodiment, if the peak value exceeds the threshold value, thus indicating the presence of voice audio, the one shot timer 244 is triggered.

One shot timer 244 provides a gating control signal to control a microphone audio path in an intercom system. In one implementation, upon receipt of a trigger signal from comparator 242, one shot timer 244 begins the countdown of a 600 msec period during which the gating output signal is asserted. Upon lapse of the count-down period, the gating output signal is deasserted. One shot timer 244 is retriggerable such that each time a new trigger signal is received, the one shot timer 244 reverts to the beginning of the count-down period.

In one embodiment, hysteresis is further provided to lessen the threshold required to re-trigger one shot timer 244 while it is active (i.e., while it is triggered and counting down). In other words, during operation if one shot timer 244 is not triggered, the peak value maintained by integrator 226 must rise above a predetermined threshold as determined by table lookup 240 before one shot timer 244 will be triggered. During the time that one shot timer 244 is triggered and is counting down, the threshold value over which the peak value must rise is decreased, thus allowing lower peak values to retrigger one shot timer 244. This feature may advantageously prevent clipping while a user is speaking.

Figure 3:
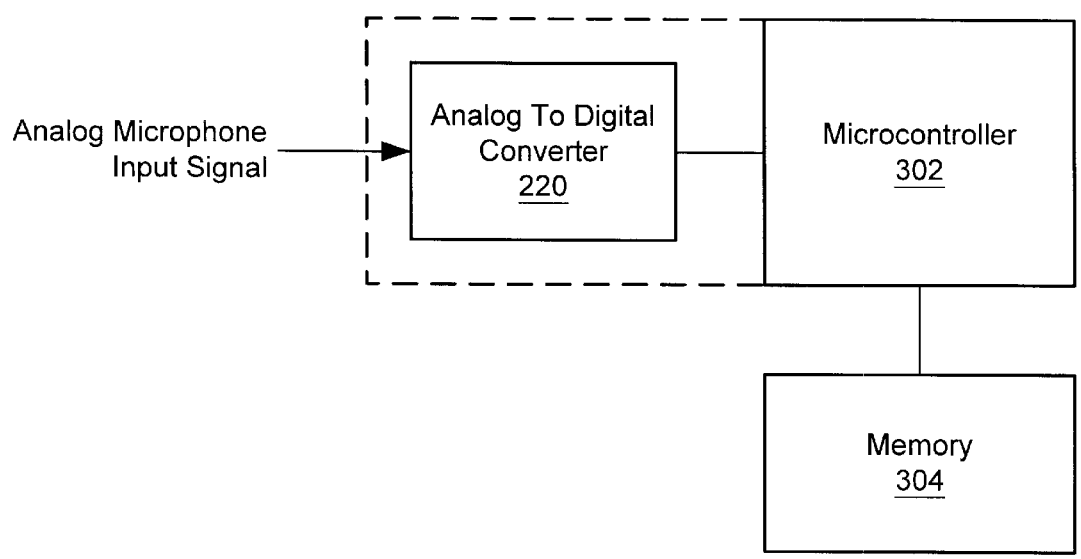
FIG. 3 is a hardware diagram illustrating a microcontroller coupled to a memory.
Figure 4:
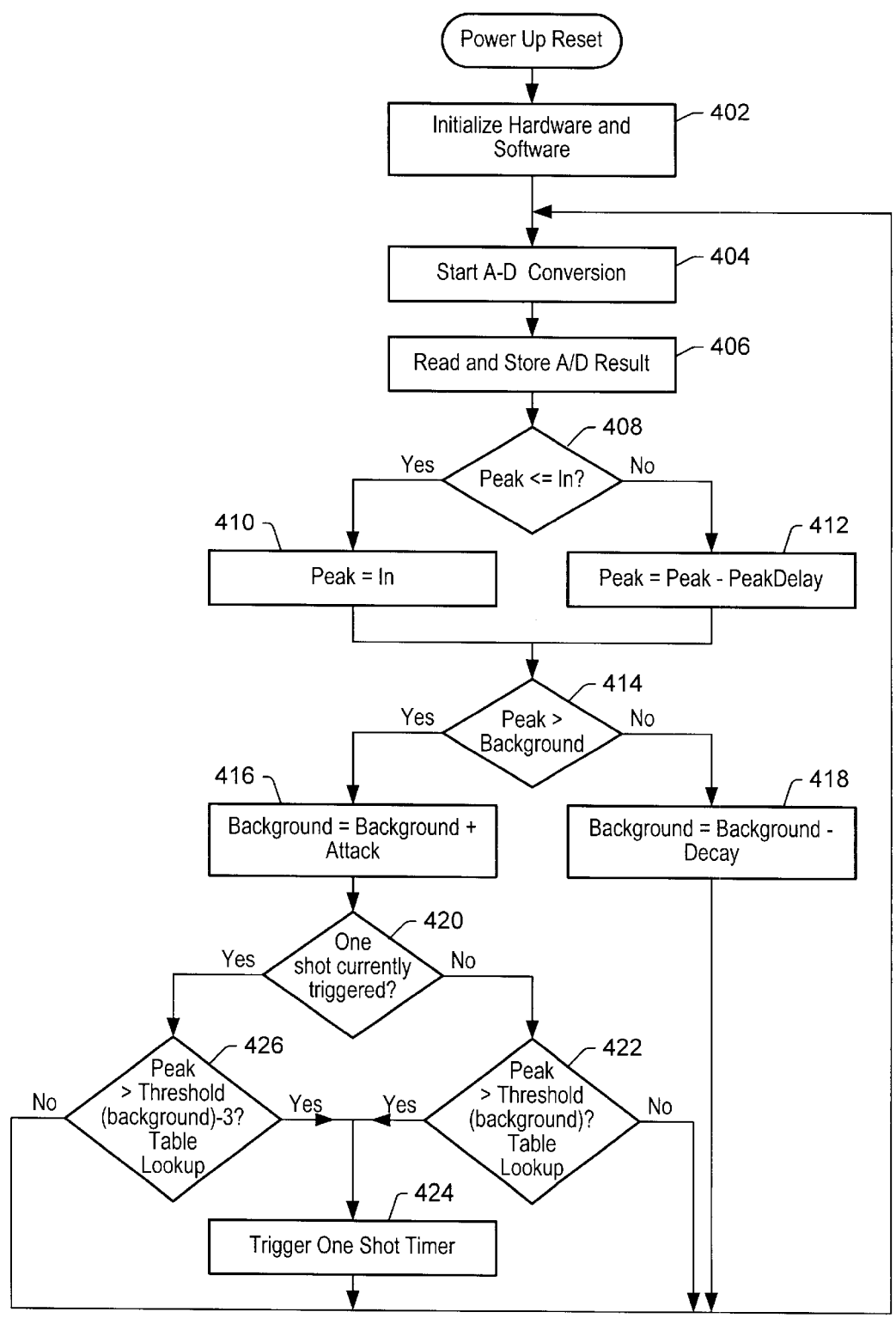
FIG. 4 is a flow diagram illustrating operations associated with the execution of exemplary software code in one embodiment.

The functionality of peak detector 222, background noise detector 228, table lookup function 240, comparator 242 and one shot timer 244, as illustrated within the functional diagram of FIG. 2, may be implemented by software code executed within a microcontroller. FIG. 3 illustrates a suitable hardware diagram for such an embodiment, and FIG. 4 illustrates operations associated with the execution of exemplary software code within such an embodiment. Details regarding this embodiment will next be considered with reference to FIGS. 2–4 collectively.

FIG. 3 illustrates a microcontroller 302 coupled to a memory 304. Memory 304 is provided to store program code, as well as to provide storage for data values, as discussed below. Memory 304 may include both read-only memory (ROM) and random access memory (RAM).

FIG. 3 further illustrates an analog to digital converter 220 (corresponding to that of FIG. 2). Analog to digital converter 220 may be incorporated as an integral portion of the integrated circuit forming microcontroller 302, or may be a discreet component. In one embodiment, microcontroller 302 is a model PICI2C671 microcontroller.

The analog to digital converter 220 receives an analog microphone input signal. As stated previously, this analog microphone input signal may be conditioned by analog conditioning circuitry (not shown).

As illustrated in FIG. 4, during operation of the system, upon power up reset, the hardware and software are initialized during step 402. This operation may include the initialization of various values maintained by the software, such as the peak value and background value as discussed further below.

Upon step 404, an analog to digital conversion is initiated by microcontroller 302. At step 406, the result of the analog to digital analog conversion is read and stored in an internal register of microcontroller 302.

The functionality of the peak detector 222, as generally depicted within FIG. 2, is implemented by the software code in steps 408, 410 and 412. More particularly, in this embodiment, code is executed to determine whether the digital input signal is greater than or equal to the peak value. If so, the peak value is assigned the value of the digital input signal at step 410. If the value of the digital input signal provided from analog to digital converter 220 is less than the peak value, the peak value is decayed by a decay constant during step 412. As depicted in FIG. 2, in one embodiment a binary value of −22 is subtracted from the peak value during this step, although it is noted that other specific decay constants may be alternatively chosen depending upon the implementation.

The functionality of background noise detector 228 generally depicted within FIG. 2 is implemented in the software code in steps 414, 416, and 418. In the particular implementation of FIG. 4, if the background value is less than or equal to the peak value, the background value is adjusted by subtracting a decay constant from the background value. In one specific implementation, this decay constant is chosen as −5, although other specific values may be alternatively chosen. If the peak value is greater than the background noise value, an attack constant is added to the background value during step 416. For the implementation depicted in FIG. 2, the attack constant is +2. Similar to the decay constants described above, other specific attack constants may alternatively be chosen depending upon the implementation.

If the peak value is greater than the background value, and if the one shot timer 244 is not currently triggered (step 420), the background value is used by a table lookup function (generally depicted by table lookup 240 in FIG. 2) implemented by the software to look up a threshold value. That is, the background value is used to index into a lookup table to obtain a corresponding threshold value. The threshold values forming the lookup table may be stored in a read only memory portion of memory 304.

If the peak value is greater than the threshold value provided by table lookup function (step 422), the one shot timer 244 is triggered at step 424. The process then repeats through a software loop to begin a new analog to digital conversion at step 404.

As described previously, hysteresis is provided within one embodiment of the system such that if the one shot timer 244 is currently triggered as determined at step 420, a lower peak value may cause the one shot timer 244 to re-trigger. More particularly, as illustrated in step 426, in one implementation a predetermined hysteresis value, such as 3, is subtracted from the threshold value obtained in the table lookup function. The resulting value is then used to determine the actual threshold point at which the one shot timer 244 will be retriggered (at step 424). As stated previously, this feature may advantageously prevent clipping while a user is speaking.

In the above embodiment, the peak value is thus indicative of peaks in the digital input signal. When no voice is presented and a relatively constant background noise is present, the background value oscillates around a particular quiescent value. As the noise level increases or decreases, this quiescent value is varied accordingly. When voice is present, the peak value is varied, reflecting this voice input. However, due to the relatively slow response of integrator 232, the background value does not change appreciably during normal speech conditions.

Figure 5:
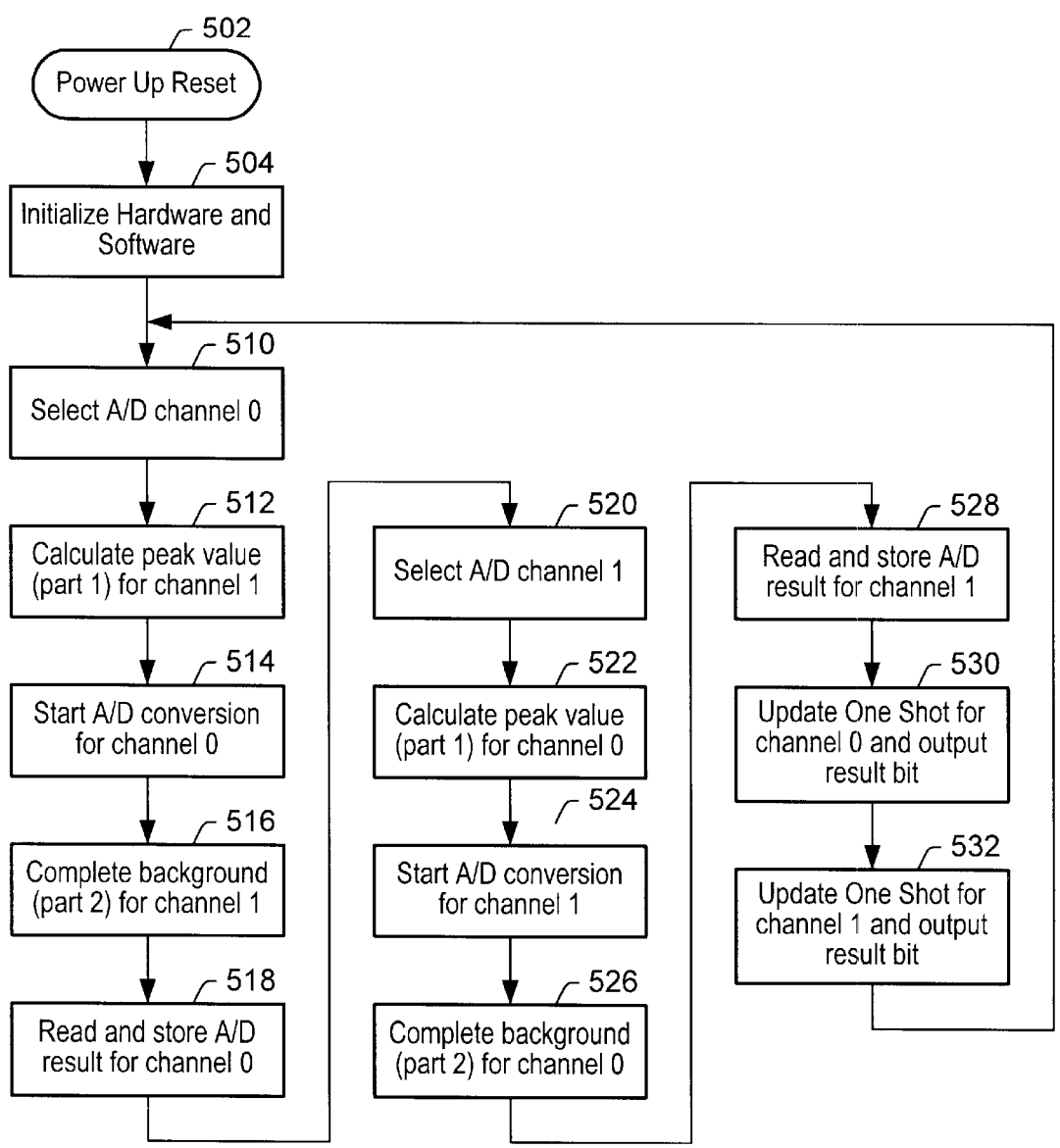
FIGS. 5, 6 and 7 illustrate an embodiment of an automatic squelch control in which two channels are processed through the execution of software code within a microcontroller.
Figure 6:
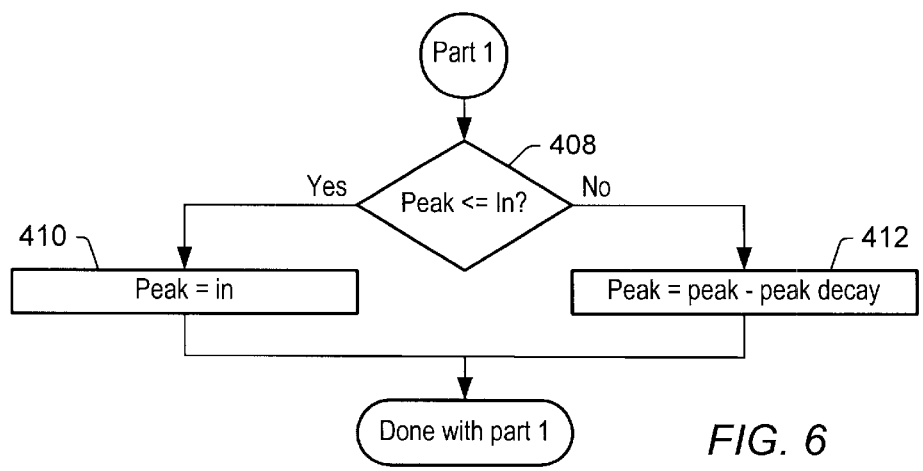
Figure 7:
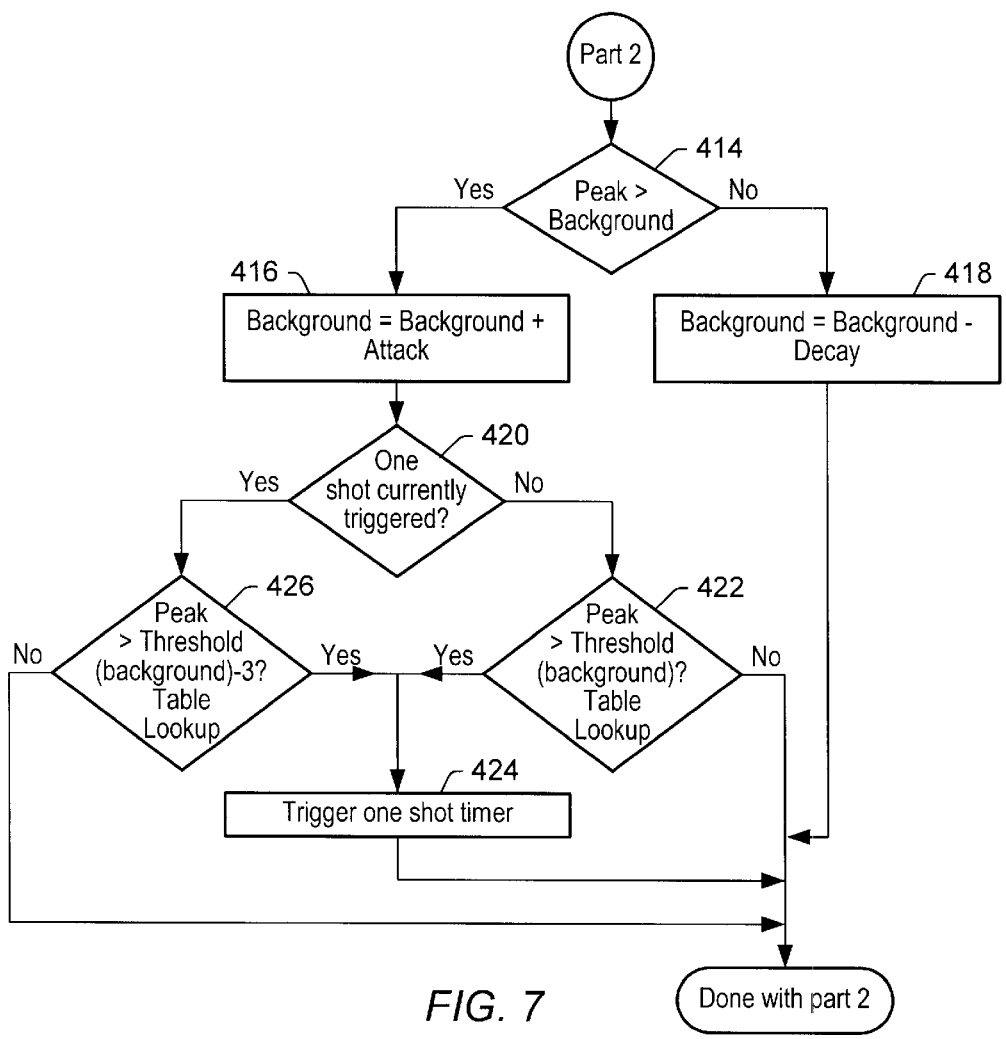

In another embodiment, microcontroller executes to code to control multiple input channels. For example, FIGS. 5-7 illustrate an embodiment in which two channels are processed through the execution of software code within microcontroller 302. Steps illustrated in FIGS. 6 and 7 that correspond to those of FIG. 4 are numbered identically for simplicity and clarity.

Upon step 510, microphone channel 0 is selected by the microcontroller to prepare for an analog to digital conversion step for channel 0. During step 512, the peak value for channel 1 is adjusted according to steps 408, 410, and 412 of FIG. 6. These steps are performed using the input value of a previous iteration of the code loop. Upon the first iteration of the code loop, this calculation is performed using initialized values.

During step 514, the analog to digital conversion for channel 0 is performed. At step 516, the background value is adjusted according to steps 414, 416 and 418 of FIG. 7. Additionally, the one shot timer for channel 1 is selectively triggered according to steps 420, 422, 424 and 426. Similar to the peak value calculation, these steps are performed using the peak value for channel 1 calculated during a previous iteration of the code loop. Upon the first iteration of the code loop, this calculation is performed using initialized values.

At step 518, the analog to digital conversion result for channel 0 is read and stored. At step 520, channel 1 is selected. During step 522, the peak value for channel 0 is calculated according to steps 408, 410 and 412. At step 524, the analog to digital conversion for channel 1 is initiated. At step 526 the background value for channel 0 is calculated according to steps 414, 416 and 418. Additionally, the one shot timer for channel 0 is selectively triggered according to steps 420, 422, 424 and 426. During step 528, the analog to digital conversion result for channel 1 is read and stored.

At steps 530 and 532, the one shot counter for each channel is updated, and an output bit for each channel indicating whether the one shot counter for each channel currently asserted is provided. These output bits control the gating of the associated microphone channel.

It is noted that while in the embodiments described above, a table lookup function 240 is implemented to obtain an threshold value depending upon a particular background value, in other embodiments, other mechanisms may be employed to obtain a threshold value based on a particular background value. For example, in one embodiment, a predetermined equation may be used to calculate a threshold value based upon a particular background value. Furthermore, in another embodiment, the threshold value may be determined by adding a predetermined constant to the background value.

In addition, while in the embodiment described above the peak value is compared to the threshold value to determine whether or not the one shot timer 244 is triggered, in another embodiment, the digital input signal from analog to digital converter 220, or another signal dependent therefrom, is used to compare with the threshold value in determining whether a trigger should be generated.

Intercom systems for use in other high noise environments may similarly employ an improved automatic squelch as described above. For example, an intercom system for use by motorcycle operators may employ the improved automatic squelch. Similarly, intercom systems employed in industrial applications associated with high noise may also employ the improved automatic squelch as described above.

Numerous variations and modifications will become apparent to those skilled in the art once the above disclosure is fully appreciated. It is intended that the following claims be interpreted to embrace all such variations and modifications.

What is claimed is:

1. An automatic squelch for an intercom system used in a small aircraft or other high noise environment, said automatic squelch comprising:
    an analog to digital converter coupled to receive an analog microphone input signal and configured to convert said analog microphone input signal into a digital input signal;
    a microcontroller coupled to said analog to digital converter and configured to execute a plurality of instructions;
    a memory configured to store said plurality of instructions;
    wherein execution of said plurality of instructions by said microcontroller includes:
        maintaining a peak value indicative of peaks in said digital input signal;
        maintaining a background noise digital value indicative of background noise, wherein said background noise digital value is adjusted in response to a result of comparing said peak value with said background noise digital value;
        determining a threshold value which depends upon said background noise digital value;
        comparing said threshold value to a value indicative of said digital input signal; and
        asserting a one shot signal for activating a microphone input path in response to a result of comparing said threshold value to said value indicative of said digital input signal.

2. The automatic squelch as recited in claim 1 wherein said execution of said plurality of instructions further includes decreasing said threshold value while said one shot signal is asserted.

3. The automatic squelch as recited in claim 1 wherein said execution of said plurality of instructions further includes comparing said peak value to said digital input signal.

4. The automatic squelch as recited in claim 3 wherein said execution of said plurality of instructions further includes setting said peak value to said digital input signal if said digital input signal is greater than said peak value.

5. The automatic squelch as recited in claim 4 wherein said execution of said plurality of instructions further includes decreasing said peak value by a first predetermined amount if said digital input signal is less than said peak value.

6. The automatic squelch as recited in claim 5 wherein said execution of said plurality of instructions further includes:
    increasing said background noise digital value by a second predetermined amount if said background noise digital value is less than said peak value; and
    decreasing said background noise digital value by a third predetermined amount if said background noise digital value is greater than said peak value.

7. The automatic squelch as recited in claim 6 wherein said first predetermined amount is greater than said second and third predetermined amounts.

8. The automatic squelch as recited in claim 6 wherein said first predetermined amount is substantially greater than said second and third predetermined amounts, whereby said peak value is generally representative of peaks in said digital input signal and said background noise digital value is generally representative of background noise in said digital input signal.

9. The automatic squelch as recited in claim 1 wherein said execution of said plurality of instructions further includes initializing said peak value and said background noise digital value.

10. The automatic squelch as recited in claim 1 wherein one shot signal is asserted for a predetermined amount of time in response to said value indicative of said digital input signal exceeding said threshold value.

11. The automatic squelch as recited in claim 2 wherein one shot signal is asserted for a predetermined amount of time in response to said value indicative of said digital input signal exceeding said threshold value.

12. The automatic squelch as recited in claim 11 wherein said predetermined amount of time is reset if said value indicative of said digital input signal exceeds a decreased threshold value while said one shot signal is asserted.

13. The automatic squelch as recited in claim 1 wherein said execution of said plurality of instructions further includes reading said digital input signal from said analog to digital converter.

14. An automatic squelch for an intercom system used in a small aircraft or other high noise environment, said automatic squelch comprising:
    an analog to digital converter coupled to receive an analog microphone input signal and configured to convert said analog microphone input signal into a digital input signal;
    a microcontroller coupled to said analog to digital converter and configured to execute a plurality of instructions;
    a memory configured to store said plurality of instructions;
    wherein execution of said plurality of instructions by said microcontroller includes:
        maintaining a peak value indicative of peaks in said digital input signal;
        maintaining a background noise digital value indicative of background noise, wherein said background noise digital value is adjusted in response to a result of comparing said peak value with said background noise digital value;

determining a threshold value which depends upon said background noise digital value;

comparing said threshold value to said peak value; and asserting a one shot signal for activating a microphone input path in response to a result of comparing said threshold value to said peak value.

15. The automatic squelch as recited in claim 14 wherein said execution of said plurality of instructions further includes decreasing said threshold value while said one shot signal is asserted.

16. The automatic squelch as recited in claim 15 wherein said execution of said plurality of instructions further includes comparing said peak value to said digital input signal.

17. The automatic squelch as recited in claim 16 wherein said execution of said plurality of instructions further includes setting said peak value to said digital input signal if said digital input signal is greater than said peak value.

18. The automatic squelch as recited in claim 17 wherein said execution of said plurality of instructions further includes decreasing said peak value by a first predetermined amount if said digital input signal is less than said peak value.

19. The automatic squelch as recited in claim 18 wherein said execution of said plurality of instructions further includes:

increasing said background noise digital value by a second predetermined amount if said background noise digital value is less than said peak value; and decreasing said background noise digital value by a third predetermined amount if said background noise digital value is greater than said peak value.

20. The automatic squelch as recited in claim 19 wherein said first predetermined amount is greater than said second and third predetermined amounts.

21. The automatic squelch as recited in claim 19 wherein said first predetermined amount is substantially greater than said second and third predetermined amounts, whereby said peak value is generally representative of peaks in said digital input signal and said background noise digital value is generally representative of background noise in said digital input signal.

22. The automatic squelch as recited in claim 15 wherein said execution of said plurality of instructions further includes initializing said peak value and said background noise digital value.

23. The automatic squelch as recited in claim 15 wherein one shot signal is asserted for a predetermined amount of time in response to said peak value exceeding said threshold value.

24. The automatic squelch as recited in claim 23 wherein said predetermined amount of time is reset if said peak value exceeds a decreased threshold value while said one shot signal is asserted.

25. The automatic squelch as recited in claim 15 wherein said execution of said plurality of instructions further includes reading said digital input signal from said analog to digital converter.

26. The automatic squelch as recited in claim 15 wherein said execution of said plurality of instructions further includes concurrently processing input signals from a plurality of microphones.

27. An intercom system for use in small aircraft comprising:

a microphone input;

a headphone output;

a signal path including a gating switch for operatively coupling said microphone input to said headphone output; and a squelch unit including:

an analog to digital converter coupled to receive an analog microphone input signal provided at said microphone input and configured to convert said analog microphone input signal into a digital input signal;

a microcontroller coupled to said analog to digital converter and configured to execute a plurality of instructions;

a memory configured to store said plurality of instructions;

wherein execution of said plurality of instructions by said microcontroller includes:

maintaining a peak value indicative of peaks in said digital input signal;

maintaining a background noise digital value indicative of background noise, wherein said background noise digital value is adjusted in response to a result of comparing said peak value with said background noise digital value;

determining a threshold value which depends upon said background noise digital value;

comparing said threshold value to said peak value; and asserting a one shot signal for activating a gating switch in response to a result of comparing said threshold value to said peak value.

28. The intercom system as recited in claim 27 wherein said execution of said plurality of instructions further includes decreasing said threshold value while said one shot signal is asserted.

29. The intercom system as recited in claim 28 wherein said execution of said plurality of instructions further includes comparing said peak value to said digital input signal.

30. The intercom system as recited in claim 29 wherein said execution of said plurality of instructions further includes setting said peak value to said digital input signal if said digital input signal is greater than said peak value.

31. The intercom system as recited in claim 30 wherein said execution of said plurality of instructions further includes decreasing said peak value by a first predetermined amount if said digital input signal is less than said peak value.

32. The intercom system as recited in claim 31 wherein said execution of said plurality of instructions further includes:

increasing said background noise digital value by a second predetermined amount if said background noise digital value is less than said peak value; and decreasing said background noise digital value by a third predetermined amount if said background noise digital value is greater than said peak value.

33. The intercom system as recited in claim 32 wherein said first predetermined amount is greater than said second and third predetermined amounts.

34. The intercom system as recited in claim 32 wherein said first predetermined amount is substantially greater than said second and third predetermined amounts, whereby said peak value is generally representative of peaks in said digital input signal and said background noise digital value is generally representative of background noise in said digital input signal.

35. The intercom system as recited in claim 28 wherein said execution of said plurality of instructions further includes initializing said peak value and said background noise digital value.

36. The intercom system as recited in claim 28 wherein one shot signal is asserted for a predetermined amount of time in response to said peak value exceeding said threshold value.

37. The intercom system as recited in claim 36 wherein said predetermined amount of time is reset if said peak value exceeds a decreased threshold value while said one shot signal is asserted.

38. The intercom system as recited in claim 28 wherein said execution of said plurality of instructions further includes reading said digital input signal from said analog to digital converter.

39. The intercom system as recited in claim 28 further comprising an additional microphone input, wherein said execution of said plurality of instructions includes concurrently processing said analog microphone input signal at said microphone input and an additional microphone input signal at said additional microphone input.

40. An automatic squelch for an intercom system used in a small aircraft or other high noise environment, said automatic squelch comprising:
   an analog to digital converter coupled to receive an analog microphone input signal and configured to convert said analog microphone input signal into a digital input signal;
   a microcontroller coupled to said analog to digital converter and configured to execute a plurality of instructions; and
   a memory configured to store said plurality of instructions, wherein said plurality of instructions includes:
   a first set of instructions for execution by said microcontroller to compare a peak value to a value of said digital input signal, to increase said peak value if said peak value is less than said value of said digital input signal, and to decrease said peak value if said peak value is greater than said value of said digital input signal;
   a second set of instructions for execution by said microcontroller to compare said peak value to a background value, to increase said background value if said background value is less than said peak value, and to decrease said background value if said background value is greater than said peak value; and
   a third set of instructions for execution by said microcontroller to trigger a one shot timer in response to determining that said peak value is greater than a predetermined threshold, wherein said predetermined threshold is dependent upon said background value.

41. The intercom system as recited in claim 40 wherein said third set of instructions further includes at least one instruction to decrease said predetermined threshold value while said one shot signal is triggered.

42. The intercom system as recited in claim 40 wherein said first set of instructions further includes at least one instruction to set said peak value to said digital input signal if said digital input signal is greater than said peak value.

43. The intercom system as recited in claim 42 wherein said first set of instructions includes at least one instruction to decrease said peak value by a first predetermined amount if said digital input signal is less than said peak value.

44. The intercom system as recited in claim 43 wherein second set of instructions further includes at least one instruction to:
   increase said background value by a second predetermined amount if said background value is less than said peak value; and
   decrease said background value by a third predetermined amount if said background value is greater than said peak value.

45. The intercom system as recited in claim 44 wherein said first predetermined amount is greater than said second and third predetermined amounts.

46. The intercom system as recited in claim 44 wherein said first predetermined amount is substantially greater than said second and third predetermined amounts, whereby said peak value is generally representative of peaks in said digital input signal and said background value is generally representative of background noise in said digital input signal.

47. The intercom system as recited in claim 41 wherein a one shot signal generated by said one shot timer is asserted for a predetermined amount of time in response to said peak value exceeding said threshold value, wherein said one shot signal controls gating of a microphone signal path.

48. The intercom system as recited in claim 47 wherein said predetermined amount of time is reset if said peak value exceeds a decreased threshold value while said one shot signal is asserted.

49. An automatic squelch for an intercom system used in a small aircraft or other high noise environment, said automatic squelch comprising:
   an analog to digital converter coupled to receive an analog audio input signal and configured to convert said analog audio input signal into a digital input signal;
   a peak detector configured to maintain a peak value indicative of peaks in said digital input signal;
   a background noise detector configured to maintain a background noise digital value indicative of background noise, wherein said background noise detector is configured to adjust said background noise digital value in response to a result of comparing said peak digital value with said background noise digital value;
   a one shot timer;
   a threshold generator for generating a threshold value which depends upon said background noise value;
   a comparator configured to compare said threshold values to a value indicative of said digital input signal;
   a one shot timer, configured to generate a one shot signal for activating a microphone input path in response to an output of said comparator.

50. An automatic squelch for an intercom system used in a small aircraft or other high noise environment, said automatic squelch comprising:
   an analog to digital converter coupled to receive an analog microphone input signal and configured to convert said analog microphone input signal into a digital input signal;
   a peak detector coupled to receive said digital input signal for maintaining a peak value indicative of peaks in said digital input signal, wherein said peak detector is configured to set said peak value to a value of said digital input signal in response to detecting that said peak value is less than said value of said digital input signal and is configured to decay said peak value by a first predetermined amount in response to detecting that said peak value is greater than said value of said digital input signal;
   a background noise detector for maintaining a background value indicative of background noise in said digital input signal, wherein said background noise detector is configured to decay said background value by a second predetermined amount in response to detecting that said background value is greater than a monitored value which is dependent upon said digital input signal, and wherein said background noise detector is configured to increase said background value by a third predetermined amount in response to detecting that said background value is less than said monitored value;

a comparator coupled to said peak detector and configured to compare said peak value to a threshold value which is dependent upon said background value; and a one shot timer for generating a one shot timer output signal to activate a microphone signal path in response to an output of said comparator.

* * * * *